United States Patent
Rozsypal et al.

[11] Patent Number: 6,097,075
[45] Date of Patent: Aug. 1, 2000

[54] SEMICONDUCTOR STRUCTURE FOR DRIVER CIRCUITS WITH LEVEL SHIFTING

[75] Inventors: Antonin Rozsypal, Roznov, Czech Rep.; Michael Zunino, Tempe, Ariz.

[73] Assignee: Motorola, Inc., Schaumburg, Ill.

[21] Appl. No.: 09/366,308

[22] Filed: Aug. 2, 1999

[30] Foreign Application Priority Data

Jul. 31, 1998 [EP] European Pat. Off. ............. 98114382

[51] Int. Cl.[7] .......................... H01L 29/00; H01L 29/76; H01L 29/94; H01L 31/062; H01L 31/113
[52] U.S. Cl. ......................... 257/500; 257/368; 257/394; 257/504
[58] Field of Search .................................. 257/368, 394, 257/500, 504

[56] References Cited

U.S. PATENT DOCUMENTS

| | | | |
|---|---|---|---|
| 4,239,558 | 12/1980 | Morishita et al. . | |
| 4,879,584 | 11/1989 | Takagi et al. . | |
| 4,907,041 | 3/1990 | Huang | 357/4 |
| 5,060,047 | 10/1991 | Jaume et al. | 357/53 |
| 5,475,335 | 12/1995 | Merrill et al. | 327/536 |
| 5,500,551 | 3/1996 | Puzzolo et al. | 257/500 |
| 5,502,412 | 3/1996 | Choi et al. | 327/333 |
| 5,550,701 | 8/1996 | Nadd et al. | 361/103 |
| 5,640,034 | 6/1997 | Malhi | 257/341 |
| 5,686,754 | 11/1997 | Choi et al. | 257/488 |
| 5,828,108 | 10/1998 | Toyoda | 257/372 |

FOREIGN PATENT DOCUMENTS

| | | |
|---|---|---|
| 0596565A2 | 5/1994 | European Pat. Off. . |
| 2300532 A | 11/1996 | United Kingdom . |
| 2310081 A | 8/1997 | United Kingdom . |
| 2318684 A | 4/1998 | United Kingdom . |

*Primary Examiner*—Ngân V. Ngô
*Attorney, Agent, or Firm*—Lanny L. Parker

[57] ABSTRACT

An arrangement (100) has a low voltage circuit (196') on a first doped well (110) and a high voltage circuit (197') on a second doped well (120) integrated into a common semiconductor substrate (105). The first well (110) laterally extends along a surface (106) of the substrate (105) to provide a voltage drop ($|V_{LARGE}|$) between a first end (111) and a second end (112) so that potential differences between the circuits (196', 197') are substantially isolated. The low voltage circuit (196') controls a current from the second end (112) to provide a variable potential (by $|V_{SMALL}|$) at the second end (112) which is communicated to other parts (193') of the second circuit (197') by a connection (150). The wells (110, 120) are spaced to provide isolation for potential magnitude changes between the second end (112) of the first well (110) and the second well (120) which are invoked by the first circuit (196').

14 Claims, 3 Drawing Sheets

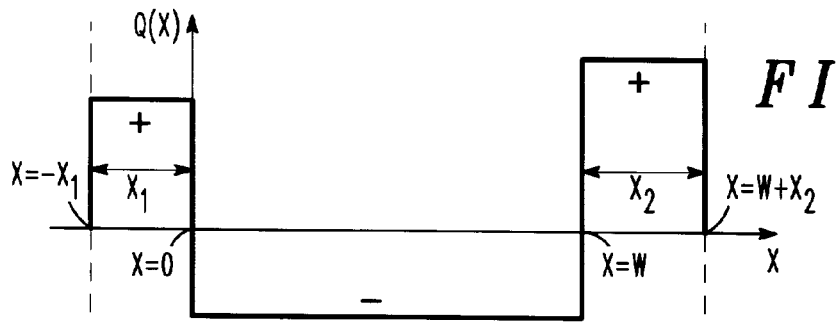
FIG. 4A
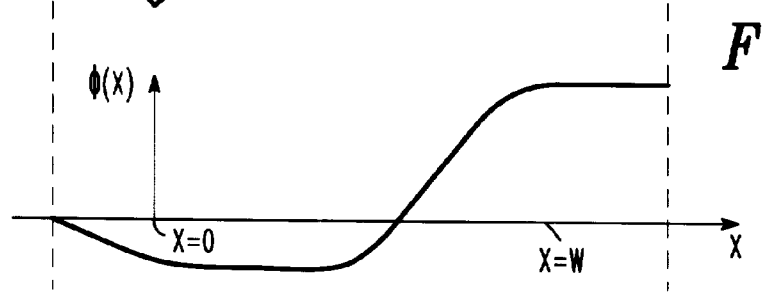
FIG. 4B
FIG. 4C
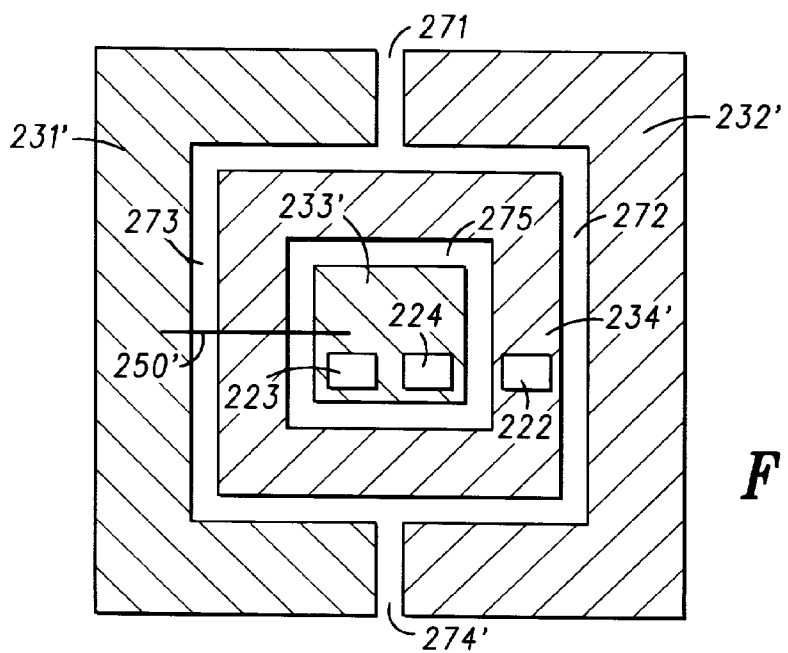
FIG. 6
200'

6,097,075

SEMICONDUCTOR STRUCTURE FOR DRIVER CIRCUITS WITH LEVEL SHIFTING

FIELD OF THE INVENTION

The present invention generally relates to electronic circuits, and, more particularly, to a semiconductor structure.

BACKGROUND OF THE INVENTION

Power supplies are widely used in many applications to adapt an input power signal in a standardized form with rated voltage and frequency to the particular output signal form needed by the application. For example, the mains power signal has a rated a.c. voltage between 100–240 volts and a frequency of 50/60 Hz (i.e., input at "high" voltage). Computers often internally require d.c. voltages of 5 and 12 volts (output at "low" voltage). Other applications, such as energy-saving lighting devices require voltages of several hundreds of volts.

There is a huge demand to provide inexpensive electronic circuits for the power supplies. The circuits should be minimized in their physical dimensions and, if possible, integrated on monolithic semiconductor substrates. To guaranty substantially constant output voltages of the power supply, control signals from the "low" circuit voltage portions to the "high" voltage circuit portions, or vice versa, are often used. Between portions with substantially different voltages, provisions are required to (a) transfer or exchange control signals and (b) substantially isolate the portions. These are sometimes conflicting requirements.

For example, in some power supplies, semiconductor switches (e.g., bipolar transistors, MOSFET transistors, thyristors), alternatively pull a node to a high end (i.e. d.c. 700 volts, rectified input voltage) and to a zero voltage line (half bridge arrangement). Then, the resulting rectangular voltage is down-transformed and rectified to a low output voltage. Preferably, the semiconductor switches are controlled by signals derived from the low output voltage. A switch driver should provide (a) transfer of control signals from the output to the semiconductor switches and (b) isolate high and low voltage portions. This is especially important for that portion of the driver which controls the switch at the high end. In other words, high and low voltage portions are floating with no reference to other. This requires, for example, space, packages, extra lead wires, etc. and is therefore not wanted.

It is known in the art to have driver circuits with floating regions integrated on a single monolithic chip together with non-floating regions. UK Patent Application 2310081 published Aug. 13, 1997 discloses a level shifting high voltage device for electrically coupling a subcircuit with a higher, floating voltage to a subcircuit with a lower voltage.

The integration of floating regions and isolation regions into monolithic integrated chips can require additional manufacturing steps (sometimes epitaxy) which are not wanted (time, resources, etc.).

Therefore, the present invention seeks to provide semiconductor structures for driver circuits and manufacturing methods which mitigate or avoid these and other disadvantages and limitations of the prior art.

BRIEF DESCRIPTION OF THE DRAWINGS

FIGS. 4A–C illustrate simplified diagrams for a charge distribution, an electrical field, and a surface potential versus a coordinate axis for the semiconductor structure of FIGS. 2–3;

FIG. 6 illustrates a simplified top view of a semiconductor structure according to the present invention in an arrangements for the driver application of FIG. 5.

DETAILED DESCRIPTION OF A PREFERRED EMBODIMENT

According to a present invention, a semiconductor structure for level shifting can be integrated together with high voltage and low voltage portions of an application (e.g., driver for power supply) on a monolithic integrated chip. The manufacturing steps for the structure are, preferably, the same steps as for the rest of the application.

The semiconductor structure can accommodate the different and sometimes conflicting requirements of transferring control signals and isolating.

Figure 1:
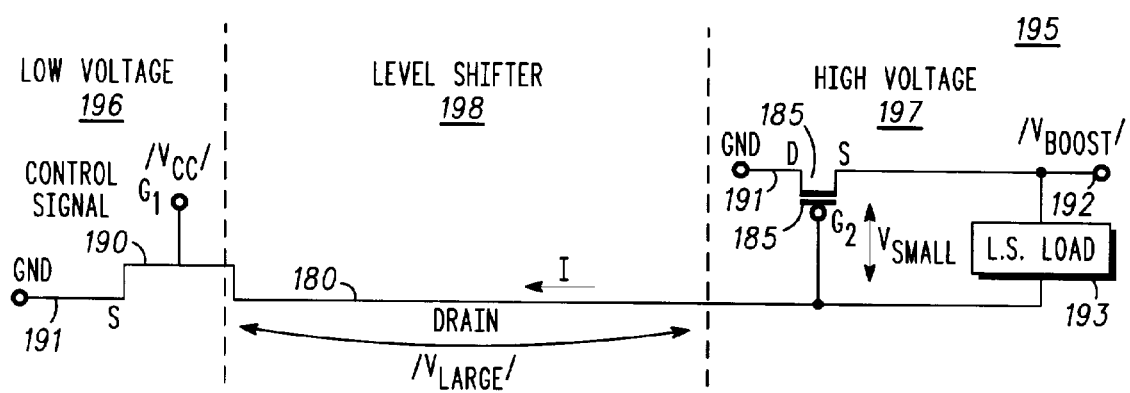
FIG. 1 illustrates a simplified circuit diagram of an electrical circuit having a low voltage portion coupled to a high voltage portion by a level shifter portion.

FIG. 1 illustrates a simplified circuit diagram of electrical circuit 195 having low voltage portion 196 (represented by gate and source of transistor 190) coupled to a high voltage portion 197 (represented by transistor 185 and level shifter load 193) by level shifter portion 198 (represented by drain 180 of transistor 190). For convenience, the portions are separated by dashed lines. FIG. 1 is very much simplified and only intended to illustrate the task which is solved by the present invention.

The terms "low" and "high" are intended to be convenient labels to indicate significant differences in voltage magnitudes. As used herein, a "low" voltage can have a useful range between 0 and 20 volts. A "high" voltage can have a useful range between 10 and 1000 volts, a convenient range between 50 and 700 volts, and, as in the preferred embodiment, preferred values of about 700 volts. In other words, "high" and "low" voltages are distinguished by useful ratios between 10 and 100.

The terms "large" and "small" in connection with changes of signals are defined similarly. A small signal change is able to switch on and off a transistors or a similar device. A "small" signal change can have a useful range between 0 and 20 volts and a convenient range between 0 and 2 volts (e.g., in case of FETs).

This definitions of "high", "low", "large" and "small" are convenient, but not essential for the present invention. Persons of skill in the art are able, based on the description herein, to apply other magnitude relations without departing from the scope of the present invention.

For example, in circuit 195, the voltages in low voltage portion 196 are equal to or smaller than $|V_{CC}|$ (e.g., ≈5 . . . 20 volts) which is temporarily present at gate $G_1$ of transistor 190). The voltages in high voltage portion 197 are equal to or smaller than $|V_{BOOST}|$ (e.g., up to ≈720 volts) present at reference line 192). Preferably, the voltages (e.g., $|V_{CC}|$, $|V_{BOOST}|$) are indicated in reference to a ground voltage of, e.g., GND ≈0 volts ("ground", at reference line 191). Conveniently, the "high voltage" $|V_{BOOST}|$ and the "low voltage" $|V_{CC}|$ are positive ("plus"). But this is not important for the present invention so that persons of skill in the are able, based on the description herein, to implement the present invention for applications with an opposite voltage sense. For convenience, voltages are therefore discussed only as absolute values (| |symbols). $|V_{BOOST}|$ is, optionally, a variable voltage having minimum voltages at around GND and maximum voltages at around $|V_{CC}+V_{DD}|$, wherein $|V_{DD}|$ is a substantially constant voltage (e.g., $|V_{DD}| \approx 700$ volts). High voltage and low voltage portions are considered as floating to each other.

The term "transistor" is intended to include any device or arrangement having at least two main electrodes (e.g., sources S and drains D) and a control electrode (e.g., a gate G). The impedance between the main electrodes is controlled by a signal applied to the control electrode. In case of field effect transistors (FETs), a current flow between the main electrodes is established along a channel. The FETs are conveniently classified into n-channel transistors (n-FET) and p-channel transistors (p-FET, in the drawings with a circle symbol ○ on the gate). Which electrode is the drain and which is the source, depends on the applied voltages, so drain and source are distinguished here only for the convenience of explanation. This is convenient for the embodiments of the present invention, but not essential. Persons of skill in the art are able, based on the description herein, to use transistor types in other combinations without departing from the scope of the invention.

In the example of FIG. 1, a source S of transistor 190 (here e.g., n-FET) is coupled to reference line 191 (GND). Gate $G_1$ of transistor 190 receives a control signal ("CONTROL SIGNAL"). Drain 180 of transistor 190 forming level shifter 198 is coupled to gate $G_2$ of transistor 185 (e.g., p-FET, gate symbol ○) and coupled to reference line 192 via level shifter load 193. Source S of transistor 185 is coupled to reference line 192 ($|V_{BOOST}|$) and drain D of transistor 185 is coupled to reference line 191 (GND). Load 193 stands for any current conducting device such as, e.g., a further transistor.

Level shifting portion 198 (e.g., with resistor 180) has a double purpose:

(a) By conducting variable signal current I between lines 192 and 191 through load 193 (current direction not important), portion 198 transfers small signal changes in portion 196 (e.g., controlled by CONTROL SIGNAL at gate $G_1$) to portion 197 which has a small variable control voltage $|V_{SMALL}|$ at gate $G_2$; and (b) Portion 198 (i.e., drain 180) provides a large signal voltage drop (e.g., voltage $|V_{LARGE}|$) which corresponds to the potential difference between $|V_{BOOST}|$ and GND.

Figure 2:
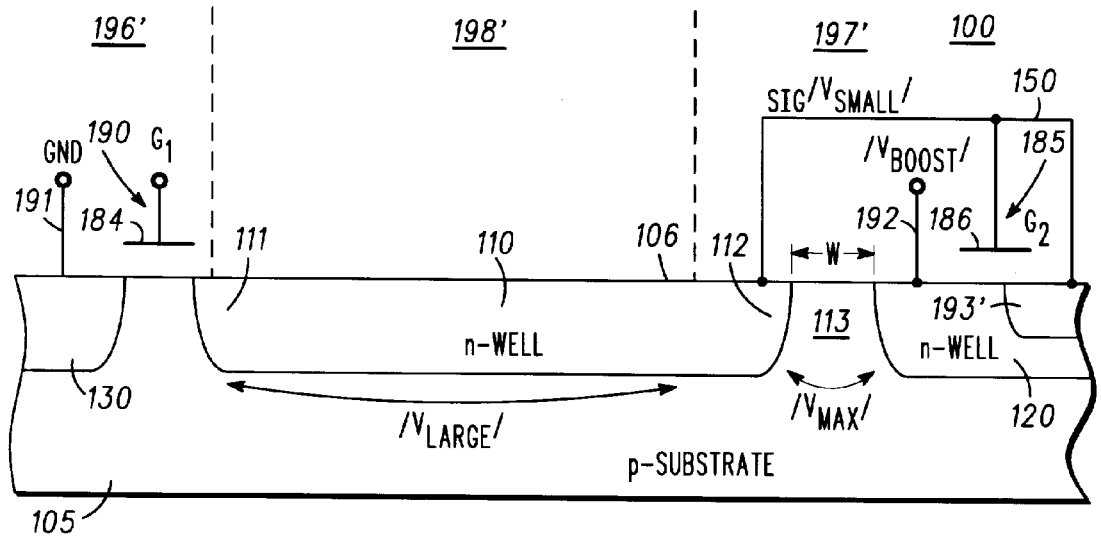
FIG. 2 illustrates a simplified cross-section view of a semiconductor structure according to the present invention.

FIG. 2 illustrates a simplified cross-section view of a semiconductor structure 100 according to the present invention. For convenience, primed reference numbers 196', 198' and 197' stand for portions corresponding to FIG. 1. According to its main function, structure 100 will also be referred to as "driver circuit". Silicon is the most commonly used semiconductor so for convenience of explanation, the following description uses silicon as an exemplary semiconductor material. Persons of skill in the art are able, based on the description herein, to use other materials without departing from the scope of the invention. For convenience of explanation, FIG. 2 illustrates structure 100 as it is available in operation, without considering manufacturing steps.

Structure 100 comprises substrate 105 having surface 106, wells 110 and 120, optional ground connection 130, optional gate 184 (e.g., of transistor 190, cf. FIG. 1), optional gate 186 (e.g., of transistor 185, cf. FIG. 1), and load 193' (cf. FIG. 1). Wells 110 and 120, connection 130 and load 193' are located in substrate 105 below surface 106.

Well 110 has regions 111 and 112. Transistor 190 (cf. FIG. 1) is formed by connection 130 (source, line 191 at GND), well 110 (i.e. drain 180), and gate 184. Region 112 of well 110 and well 120 are spaced at a distance W. In other word, wells 110 and 120 are spaced by gap 113. Well 120 is coupled to line 192 at $|V_{BOOST}|$. Connector 150 couples region 112 to gate $G_2$ (186) of transistor 185 and to load 193'. Persons of skill in the art understand that an electrical contact between connector 150 and region 112 and load 193' can be obtained by, for example, local diffusions (higher doping). For simplicity, such diffusions are not shown in detail.

Transistors 190 and 185 are not important for the present invention and intended only to serve as a convenient example. Level shifting portion 198 (cf. FIG. 1) is formed by the extension of well 110 between regions 111 and 112 and by the distance W:

(a) Well 110 conducts variable current I and transfers small signal changes of transistor 190 to transistor 186 (via connector 150). The potential SIG at region 112 alternates by $|V_{SMALL}|$. The isolation between wells 110 and 120 must withstand only the highest expected changes of $|V_{SMALL}|$. In other words, the distance W is such to withstand a predetermined isolation voltage $|V_{MAX}|$ between wells 110 and 120. Convenient values are, for example, $|V_{MAX}| \approx 25 \ldots 35$ volts (10 to 50 volts useful) and $W \approx 5 \ldots 20$ μm (micrometers).

(b) Well 110 also provides the large signal voltage drop (i.e., voltage $|V_{LARGE}|$). In other words, well 110 is laterally extended to provide a voltage drop $|V_{LARGE}|$ substantially larger than the isolation voltage ($|V_{LARGE}| >> |V_{MAX}|$).

Preferably, substrate 105 is—relative to wells 110 and 120—lightly p-doped; and wells 110 and 120 are n-doped. In other words, substrate 105 and wells 110/120 are of a first and a second, opposite conductivity type. "First conductivity type" and "second conductivity type" can refer to either p-conductivity (doping) or n-conductivity (doping), as the case may be. Persons of skill in the art know how to provide wells, for example, by diffusion, without the need of further explanation. The manufacturing steps for structure 100 are known in the art as such and, preferably, do not differ from the other steps which are applied for the rest of the integrated circuit on the complete chip. It is also a great advantage of the present invention, that epitaxy is not required.

Preferably, wells 110 and 120 have different carrier availabilities. The well with the higher carrier availability (e.g., well 120) has a higher voltage magnitude (e.g., $|V_{DD}|$, $|V_{BOOST}|$) in reference to a ground voltage (GND) than the well with the lower carrier availability (e.g., well 110). In the example of FIG. 2, well 120 is more n-doped than well 110. Well 120 is, preferably, as low as possibly n-doped to prevent a break between line 192 and substrate 105, and is a high as possibly n-doped to prevent punch-through between load 193' (e.g., p-doped) and substrate 105 (e.g., also p-doped).

When a voltage is applied to structure 100, well 110 is partly depleted so that a voltage drop is also achieved by an electric field gradient across well 110. On the other hand, depletion is substantially avoided in well 120.

Figure 3:
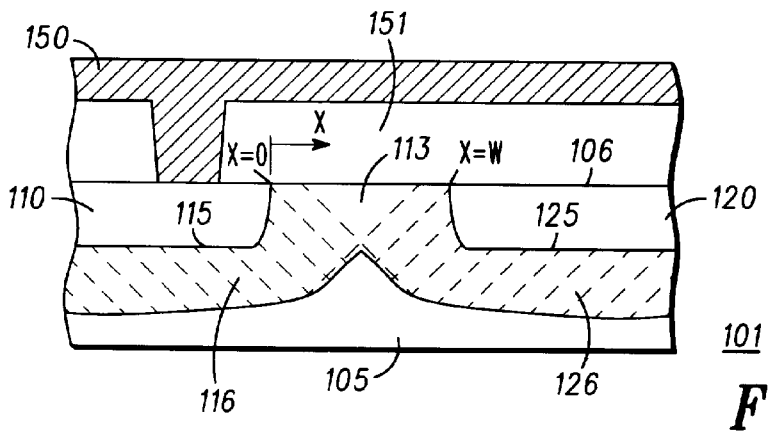
FIG. 3 illustrates a simplified cross-section view of part of the semiconductor structure of FIG. 2 with more detail.

FIG. 3 illustrates a simplified cross-section view of portion 101 of semiconductor structure 100 with more detail. Like reference number (105, 106, 110, 113, 120, 150) are used to identify like elements. Substrate 105 with surface 106, wells 110, 120 and connector 150 have already been introduced in FIG. 2. Substrate 105 (e.g., p-doped) and well 110 (e.g., n-doped) form conductivity type junctions 115

(e.g., pn-junction) having space charge regions 116 (dashed lines) extending into substrate 105. Similarly, substrate 105 and well 120 (e.g., also n-doped) form junction 125 with space charge region 126 (dashed lines). For convenience of further explanation, coordinate axis X goes along surface 106 with X=0 at the edge of well 100 and X=W at the edge of well 120. The maximum value of distance W is such that in substrate 105, space charge regions 116 and 126, preferably, overlap. The minimum value of W is dimensioned such to withstand $|V_{MAX}|$. For convenience, wells 110 and 120 are not illustrated completely. Connector 150 connects to well 110, passes over parts of well 120 and goes further to components in well 120 and is preferably, a metal connector. Connector 150 is isolated from surface 106 by oxide 151.

FIGS. 4A–C illustrate simplified diagrams for a charge distribution Q(X) (FIG. 4A), an electrical field E(X) (FIG. 4B), and a surface potential φ(X) (FIG. 4C) versus coordinate axis X (see FIG. 3) for the semiconductor structure of FIGS. 2–3. It is assumed that well 120 is coupled to (positive) voltage $|V_{BOOST}|$ and well 110 is coupled to ground. Electrical field E(X) and potential φ(X) is referenced to ground GND. For simplicity of explanation, it is assumed that the charge, field and potential distributions are zero at distance $X_1$ to the left of X=0, and at a distance $X_2$ to the right of X=W. The charge distribution Q(X) in FIG. 4A is substantially in a equilibrium where donors in well 110 (e.g., donor concentration multiplied with $X_1$) and donors in well 120 (e.g., donor concentration multiplied with $X_2$) are partially mirrored to acceptors in gap 113 on substrate 105 (e.g., acceptor concentration multiplied with W). The electrical field E(X) in FIG. 4B is an integral over Q(X), and the potential φ(X) in FIG. 4C is an integral over E(X).

Figure 5:
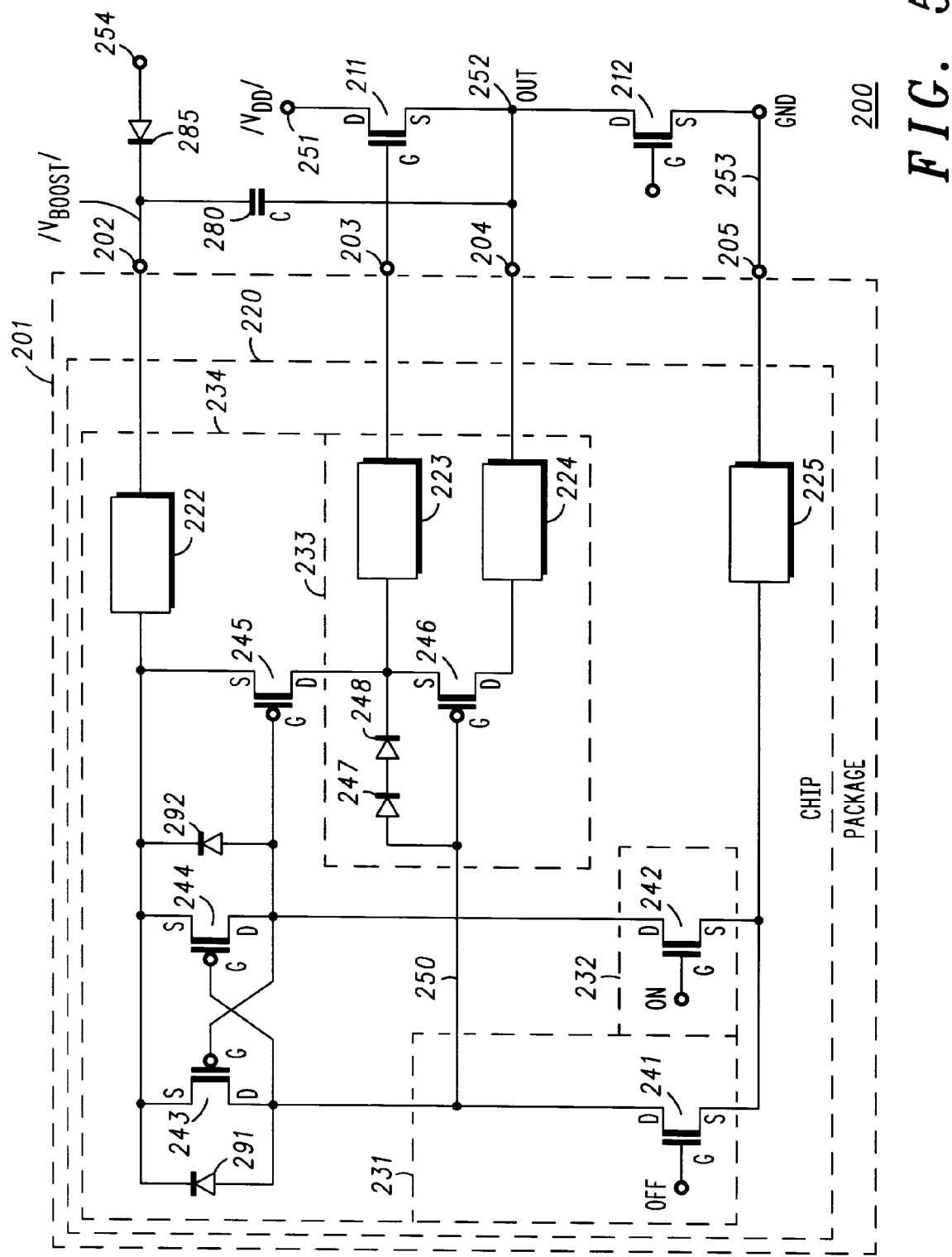
FIG. 5 illustrates a simplified circuit diagram of a driver application with portions bordered by pluralities of semiconductor structures of FIGS. 2–3.

FIG. 5 illustrates a simplified circuit diagram of driver application 200 with portions bordered by semiconductor structures of FIGS. 2–3. FIG. 5 is intended to illustrate only an example. Persons of skill in the art are able, based on the description herein, to use the present invention also for other applications.

Application 200 comprises package 201 (dashed frame) having pins 202–205, external transistors 211 and 212, diode 285 and capacitor 280. Package 201 comprises chip 220 (dashed frame) having pads 222 to 225 bonded to pins 202 to 205, respectively. Chip 220 further comprises portions 231–234 (dashed frames). Portions 231–234 are located in separate wells (cf. wells 110 and 120) to provide isolation and, optionally, signal transfer. In other words, the dashed lines around the portions symbolize structures (such as structure 100 with gaps 113) of the present invention. However, the physical location of portions 231–234 can be different. An example is explained in connection with FIG. 6.

The portions in FIG. 5 are conveniently illustrated with transistors and pads. The portions can, however, optionally comprise other components such as resistors (not illustrated) and zener diodes 291, 292, 247 and 248.

The drain D of external transistor 211 (e.g., n-FET) receives voltage $|V_{DD}|$ (e.g., d.c. 700 volts) from line 251. The source S of transistor 211 is coupled to the drain D of external transistor 212 (e.g., also n-FET) to form output node 252. The source S of transistor 212 is coupled to ground line 253 (GND). As known in the art, transistors 211 and 212 switch output node 252 alternatively to $|V_{DD}|$ or to GND to provide substantially rectangular output signal OUT.

Driving of transistor 212 is possible at its gate G with signals oscillating in a low voltage range (e.g., around 10 volts). This is well known in the art so that more details are not needed here. Driving transistor 211 (at the "high" side) is driven using the present invention. The gate G of transistor 211 is coupled to the sources of transistor 246 (e.g., p-FET) of portion 233 by pin 203 and a bond wire to pad 223 (in portion 233). Similarly, in a feedback path, output node 252 is coupled to the drain of transistor 246 via pin 204, a bond wire, and pad 224 (in portion 233). With this arrangement, transistor 211, 212 and 246 are floating in respect to the other portions.

The anode electrode of diode 285 is coupled to reference line 254 at $|V_{CC}|$ (e.g., 20 volts) and the cathode of diode 285 is coupled to pin 202. Capacitor 280 is coupled between the cathode of diode 285 and output node 252 to provide voltage $|V_{BOOST}|$ at pin 202. In the example of FIG. 5, capacitor 280 has a capacity magnitude C between 1 and 100 nF (nano farad). This value is convenient for explanation, but not essential. Other values can also be used. Voltage $|V_{BOOST}|$ follows the voltage at output node 252 and thereby substantially oscillates between $|V_{CC}|$ (when transistor 212 is conductive, OUT≈GND) and $V_{DD}+V_{CC}$ (when transistor 211 is conductive, OUT≈$V_{DD}$). A voltage higher than $|V_{DD}|$ is required to switch on transistor 211 (n-FET). This switching voltage is forwarded from pin 202/pad 222 to transistor 211 by transistor 245 in portion 234.

In portion 231, transistor 241 (e.g., n-FET) has a source S coupled to ground pin 205 via pad 225 and a drain located in a well (see region 111 of well 110) of a structure of the present invention. Transistor 241 receives a control signal (e.g., "OFF") from low voltage circuitry located, preferably, also in portion 231.

Similarly, in portion 232, transistor 242 (e.g., also n-FET) has a source S coupled to ground pin 205 via pad 225 and a drain D located in a well of another structure of the present invention. Transistor 242 receives a control signal (e.g., "ON") from other low voltage circuitry, preferably, located in portion 232.

In portion 234, the sources of transistors 243, 244 and 245 (e.g., all p-FETs) are coupled to pin 202 at $|V_{BOOST}|$ via pad 222 and, e.g., a bond wire. The drain D of transistor 243 is coupled to the drain of transistor 241 of portion 231 as an extended drain such as, e.g., illustrated structure 100. Similarly, the drain D of transistor 244 is coupled to the drain of transistor 242 of portion via another extended drain (e.g., structure 100). The gates G of transistors 243 and 244 are cross-coupled to form a flip-flop: The gate G of transistor 243 is coupled to the drain D of transistor 244; and the gate G of transistor 244 is coupled to the drain D of transistor 243. The drain D of transistor 244 is also coupled to the gate G of transistor 245. The drain D of transistor 245 is coupled to the source of transistor 246 (portion 233).

Diode 291 is coupled with its cathode to the source of transistor 243 and with its anode to the drain of transistor 243. Similarly, diode 292 is coupled with cathode and anode to source and drain, respectively, of transistor 244. Diodes 291 and 292 limit the voltage across the source-drain paths of transistors 243 and 244 and limit the voltage between their drains and GND. This feature is convenient because it also reduces the isolation requirements from portion 234 to other portions. Similarly, in portion 233, diodes 247 and 248 are serially coupled between source S and gate G of transistor 246 (cathode of 248 to S, anode of 247 to G).

Portions 231 and 233 are coupled by connector 250 (cf. connector 150 in FIGS. 2–3) going from the drain D of transistor 241 to the gate G of transistor 246.

Portions 231 and 232 which are isolated by extended drains in structures 100 of the present invention from each other operate at low voltages. Portions 231 and 232 are isolated by extended drains in structures 100 from portion 234 (higher voltages) and use the structures to communicate control signals (not shown). Similarly, portions 234 and 233 (highest voltages) are isolated.

FIG. 6 illustrates simplified top view 200' to semiconductor structures according to the present invention in an arrangement for driver application 200 of FIG. 5. For convenience, wells 231'–234' are illustrated by hatching. Wells 231'–234'corresponds to portions 231–234, respectively, of FIG. 5. Gaps 271–275 correspond to gap 113 of FIG. 2. For example, gaps 271 and 274 are located between low voltage wells 231' and 232'; gap 272 and 273 are located between low voltage wells 231', 232' (level of ON/OFF signals), respectively, and higher voltage well 234' (voltage $|V_{CC}|$). Well 234' ($|V_{CC}|$), surrounds well 233' with the highest voltage ($|V_{BOOST}|$)separated by gap 275. FIG. 6 also illustrates the location of pads 223 and 224 above well 233', of pad 222 above well 234', and of connector 250' (cf. connectors 150 in FIGS. 2–3 and 250 in FIG. 5) from well 231' to well 233'. The well arrangement of FIG. 6 is not essential for the present invention, so that persons of skill in the art can apply other arrangements.

Persons of skill in the art, are able, based on the description herein, to manufacture structure 100, 200, 200' without the need of detailed explanations. In the example of FIG. 6, first, low dose doping can be applied to wells 231', 232', 233' and 234', and second, after masking with e.g., photoresist, high dose doping can be applied to wells 233' and 234'.

Having described details of the present invention in connection with the FIGS., the present invention is now described as an apparatus (e.g., application 200 of FIGS. 5–6) with a semiconductor structure (or structures) which comprises: (a) substrate 105 of a first conductivity type (e.g., lightly p-doped); (b) well 110 of a second, opposite conductivity type (e.g., n-doped) located on substrate 105, such as to form junction 115; (c) well 120 (also second conductivity type) located on substrate 105, such as to form second junction 125, well 120 being spaced on the surface 106 from well 110 by distance W, wherein distance W is (i) small enough that in substrate 105, space charge region 116 of first junction 115 substantially overlaps space charge region 126 of junction 125, and (ii) large enough to withstand a predetermined isolation voltage $|V_{MAX}|$ between wells 110 and 120.

Further, the present invention is described as a driver circuit (e.g., circuit 100) with a first control input (e.g., gate G, of transistor 190) in reference to a first reference connection (e.g., line 191 at GND) for providing a variable control voltage to a semiconductor device (e.g., transistor 185) having a second control input (e.g., gate $G_2$) in reference to a second reference connection (e.g., line 192 at $|V_{BOOST}|$), the driver circuit integrated on a monolithic substrate (e.g., p-substrate 105). The driver circuit (100) desirably includes:

(a) a variable resistance (e.g., transistor 190, n-FET) controlled by the first control input (e.g., gate $G_1$);

(b) a first well (e.g., n-well 110) having a first region (e.g., region 111) adjacent to the variable resistance and having a second region (e.g., region 112) to provide a large signal voltage drop (e.g., $|V_{LARGE}|$ which substantially corresponds to a potential difference between the second and first reference connections (e.g., difference $|V_{BOOST}$—GND $|$ between lines 191 and 192); and (c) a second well (e.g., n-well 120, the floating circuit) coupled to the second reference connection and spaced from the second region (e.g., 112) of the first well (110) by a distance (e.g., distance W) which is large enough to withstand a small signal voltage drop (e.g., $|V_{MAX}|$), the first well (e.g., n-well 110) and the variable resistance (e.g., transistor 190) conducting a current (e.g., current I) between the first and second reference connections (e.g., lines 191, 192), the current changing in response to a small signal (e.g., CONTROL SIGNAL) on the control first input (e.g., gate G.) such that the variable control voltage (SIG) at the second region (e.g., region 112) of the first well exhibits a corresponding small signal change ($|V_{SMALL}| \leq |V_{MAX}|$) in reference to the second reference connection (e.g., line 192 at $|V_{BOOST}|$), So as to control the semiconductor device (e.g., to control transistor 185).

Still further, the present invention can be conveniently described in reference to the examples in FIGS. 2 and 5 as an arrangement (e.g., application 200) of a first circuit (e.g., portion 231 with transistor 241) on a first well (cf. well 110) and a second circuit (e.g., portion 234, e.g., transistors 243 and 244) on a second well (cf. well 120) integrated into or on a common semiconductor substrate (e.g., substrate 105). The arrangement characterized in that:

The first well is laterally extended (e.g., long drain D of transistor 241) along surface 106 of substrate 105 to provide voltage drop $V_{LARGE}$ between a first end (e.g., region 111 as drain D of transistor 241 near the channel of transistor 241) and a second end (e.g., region 112) so that potential differences (e.g., $|V_{BOOST}$–GND$|$) between the circuits (e.g., portions 234 and 231) are substantially isolated;

The first circuit (e.g., portion 231) controls a current (e.g., I by transistors 241) from a control terminal (e.g., at region 112) at the second end (at region 112) to a reference connection (e.g., at GND on pad 225, line 252) as to provide a variable potential at the control terminal which is communicated to the second circuit (e.g., portion 234) by a connector (e.g., connector 150, to gate $G_2$ corresponding to gate G of transistor 244);

The first and second wells are spaced apart (e.g., by W) so as to provide isolation (voltage $V_{MAX}$) of potential magnitude changes at the control terminal which are invoked by the first circuit.

Applications using the present invention can be produced with existing manufacturing processes without substantially adding costs. The present invention can therefore provide low-cost solutions for the power supply market, the lighting market, and for other mass markets where isolation of different portions of a circuit operating at substantially different voltages is needed.

While the invention has been described in terms of particular structures, devices and methods, those of skill in the art will understand based on the description herein that it is not limited merely to such examples and that the full scope of the invention is properly determined by the claims that follow.

What is claimed is:

1. An apparatus with a semiconductor structure, comprising:

a substrate of a first conductivity type;

a first well of a second, opposite conductivity type located on said substrate, so as to form a first junction, said first well laterally extended to provide a voltage drop substantially larger than a predetermined isolation voltage;

a second well of said second conductivity type located on said substrate, so as to form a second junction, said second well being spaced on the surface from said first well by a lateral distance, wherein (a) said distance is small enough that in said substrate, a first space charge region of said first junction substantially overlaps with a second space charge region of said second junction, and (b) said distance is large enough to withstand said predetermined isolation voltage between said first and second wells.

2. The apparatus of claim 1 wherein said first well is conductive by depletion.

3. The apparatus of claim 1 wherein:

(a) said first well is coupled to a first circuit integrated into said substrate and substantially coupled to a first reference connection;

(b) said second well is coupled to a second circuit integrated into said substrate and coupled to a second reference connection; and (c) said first well provides isolation between said first and second circuits and carries a signal current between said reference connections, said signal current being controlled by said first circuit such that a portion of said first well which is located at said distance has a potential which is variable.

4. The apparatus of claim 3 wherein the potential in a region of said first well which is located at said distance is used to control components in said second well.

5. The apparatus of claim 1 wherein said first conductivity type is p-type and said second conductivity type is n-type.

6. The apparatus of claim 1 wherein said first and second wells have different carrier availabilities, the well with the higher carrier availability being connected to a higher voltage magnitude in reference to a ground voltage than the well with the lower carrier availability.

7. The apparatus of claim 1 wherein said first well is used as a field effect transistor drain.

8. The apparatus of claim 1 wherein said substrate is lightly doped relative to said wells.

9. The apparatus of claim 1 wherein said distance is substantially between 5 to 20 micrometers.

10. The apparatus of claim 1 wherein said predetermined isolation voltage has absolute values in the range between 10 and 50 volts.

11. The apparatus of claim 1 wherein said predetermined isolation voltage has absolute values in the range between 25 and 35 volts.

12. A driver circuit which is integrated on a monolithic substrate, comprising:

a first control input in reference to a first reference connection for providing a variable control voltage to a semiconductor device which has a second control input in reference to a second reference connection;

a variable resistance controlled by said first control input;

a first well having a first region adjacent said variable resistance and having a second region to provide a large signal voltage drop which substantially corresponds to a potential difference between said second and first reference connections; and a second well coupled to said second reference connection and spaced from said second region of said first well by a distance which is large enough to withstand a small signal voltage drop, said first well and said variable resistance conducting a current between said first and second reference connections, said current changing in response to a small signal on said first control input so that said variable control voltage at said second region of said first well exhibits a corresponding small signal change in reference to said second reference connection, as to control said semiconductor device.

13. The driver circuit of claim 12 wherein said semiconductor device is integrated into said second well.

14. An arrangement of a first circuit on a first doped well and a second circuit on a second doped well integrated into a common semiconductor substrate, said arrangement characterized in that:

said first well extends along a surface of said substrate to provide a voltage drop between a first end and a second end so that potential differences between said first and second circuits are substantially isolated; wherein said first circuit controls a current from said second end so as to provide a variable potential which is communicated to other parts of said second circuit by a connection; and said first and second wells are spaced so as to provide isolation for potential magnitude changes invoked by said first circuit between said second end and said second well.

* * * * *